United States Patent
Vogelsang et al.

(10) Patent No.: US 10,154,220 B2
(45) Date of Patent: Dec. 11, 2018

(54) IMAGING SYSTEM WITH DYNAMIC RECONSTRUCTION WORKLOAD ALLOCATION

(71) Applicant: Rambus Inc., Sunnyvale, CA (US)

(72) Inventors: Thomas Vogelsang, Mountain View, CA (US); Jay Endsley, San Jose, CA (US); Michael Guidash, Rochester, NY (US); Craig M. Smith, Spencerport, NY (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/563,875

(22) PCT Filed: Mar. 31, 2016

(86) PCT No.: PCT/US2016/025174
§ 371 (c)(1),
(2) Date: Oct. 2, 2017

(87) PCT Pub. No.: WO2016/164242
PCT Pub. Date: Oct. 13, 2016

(65) Prior Publication Data
US 2018/0124343 A1    May 3, 2018

Related U.S. Application Data

(60) Provisional application No. 62/144,223, filed on Apr. 7, 2015.

(51) Int. Cl.
*H04N 5/378* (2011.01)
*H04N 5/353* (2011.01)
(Continued)

(52) U.S. Cl.
CPC ....... *H04N 5/378* (2013.01); *H01L 27/14634* (2013.01); *H04N 5/357* (2013.01);
(Continued)

(58) Field of Classification Search
CPC ...... H04N 5/378; H04N 5/3535; H04N 5/369; H04N 5/357; H04N 5/35581; H04N 5/3532; H04N 5/35572; H01L 27/14634
See application file for complete search history.

(56) References Cited

U.S. PATENT DOCUMENTS 7,324,141 B2   1/2008   Kubo et al.
7,596,284 B2   9/2009   Samadani
(Continued)

FOREIGN PATENT DOCUMENTS

WO   WO-2014-055391 A2   4/2014

OTHER PUBLICATIONS

Notification Concerning Transmittal of International Preliminary Report on Patentability dated Oct. 19, 2017 re: Int'l Appln. No. PCT/US16/025174. 6 Pages.

*Primary Examiner* — Padma Haliyur
(74) *Attorney, Agent, or Firm* — Charles Shemwell (57) ABSTRACT

Multiple image data subframes corresponding to respective portions of an exposure interval are generated within a sensor device of an image system. Depending on whether the exposure interval exceeds one or more exposure time thresholds, data representative multiple image data subframes are output from the image sensor device in one of at least two formats, including a first format in which each of the subframes of image data is output in its entirety, and a second format in which a logical combination of at least two of the subframes of image data is output instead of the at least two of the subframes of image data such that the total volume of image data output from the image sensor device is reduced relative to the first format.

24 Claims, 4 Drawing Sheets

(51) Int. Cl.
  *H04N 5/355* (2011.01)
  *H04N 5/357* (2011.01)
  *H04N 5/369* (2011.01)
  *H01L 27/146* (2006.01)

(52) U.S. Cl.
  CPC ......... *H04N 5/3532* (2013.01); *H04N 5/3535* (2013.01); *H04N 5/35572* (2013.01); *H04N 5/35581* (2013.01); *H04N 5/369* (2013.01)

(56) References Cited

U.S. PATENT DOCUMENTS

| | | | |
|---|---|---|---|
| 7,663,281 B1 | 2/2010 | Chang et al. | |
| 7,755,677 B2 | 7/2010 | Kaplinsky | |
| 8,462,220 B2 | 6/2013 | Barna et al. | |
| 8,488,034 B2* | 7/2013 | Nishihara | G01J 1/44 348/297 |
| 9,036,065 B1* | 5/2015 | Vogelsang | H04N 5/378 348/308 |
| 2005/0013509 A1* | 1/2005 | Samadani | G06T 3/4007 382/302 |
| 2006/0100314 A1 | 5/2006 | Arifuku et al. | |
| 2006/0125932 A1 | 6/2006 | Lu et al. | |
| 2007/0052845 A1* | 3/2007 | Adams | H04N 5/142 348/452 |
| 2007/0242900 A1* | 10/2007 | Chen | G06T 5/50 382/294 |
| 2011/0141318 A1 | 6/2011 | Lee et al. | |
| 2011/0157395 A1 | 6/2011 | Compton | |
| 2012/0138774 A1* | 6/2012 | Kelly | G11B 20/00086 250/208.1 |
| 2014/0054446 A1* | 2/2014 | Aleksic | H01L 27/14609 250/208.1 |
| 2014/0103190 A1* | 4/2014 | Lee | H01L 27/14612 250/208.1 |
| 2014/0293102 A1 | 10/2014 | Vogelsang et al. | |
| 2015/0070544 A1* | 3/2015 | Smith | H01L 27/14641 348/297 |
| 2015/0092076 A1 | 4/2015 | Campbell et al. | |

* cited by examiner

FIG. 9
Logic Die
(w/in sensor stack)

IMAGING SYSTEM WITH DYNAMIC RECONSTRUCTION WORKLOAD ALLOCATION

TECHNICAL FIELD

The present disclosure relates to the field of integrated-circuit image sensors.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, an output image frame is reconstructed from multiple-subframes of image data in either one or both of two interconnected IC (integrated-circuit) dies of an imaging system in accordance with one or more image capture parameters and thus, in the case of scene-responsive capture configuration, in accordance with one or more characteristics of the image scene itself. In a number of embodiments, the imaging system includes a stacked image sensor die/logic circuit die, referred to herein as a "sensor stack," coupled to a processing unit (e.g., an image system processor (ISP), system-on-chip (SoC), etc.) via a relatively narrow-bandwidth chip-to-chip signaling path, and carries out image reconstruction on either or both sides of that signaling path depending on the rate of subframe image data production and temporary image data storage (buffer memory) requirements. In a more particular embodiment in which the image data production rate and required buffer memory have inverse dependencies on exposure time (i.e., one falling, the other rising as exposure time changes), allocation of image reconstruction workload (i.e., operations executed to reconstruct an output image frame) is dynamically shifted partially and then completely from the sensor stack to the processing unit to keep required data transfer bandwidth under the ceiling imposed by the relatively narrow-bandwidth signaling interface and to limit data buffering memory required on the sensor stack, balancing demands for those critical resources.

Figure 1:
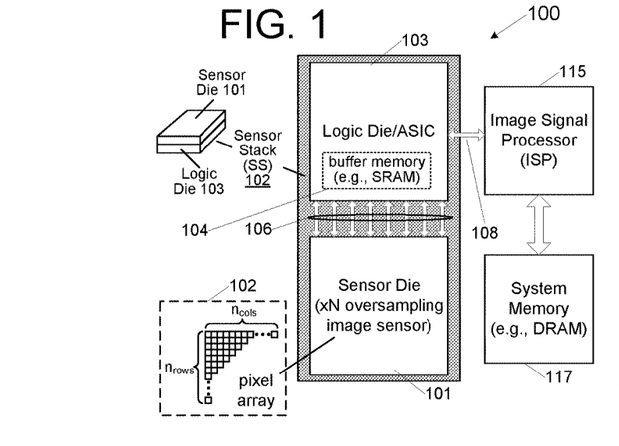
FIG. 1 illustrates an imaging system embodiment in which reconstruction workload is dynamically allocated between different system components.

FIG. 1 illustrates an imaging system embodiment 100 in which reconstruction workload is dynamically allocated between different system components according to various techniques (and using various circuit arrangements) detailed further below. As shown, imaging system 100 includes an oversampling image sensor 101 and associated logic die 103 arranged in a stacked-die package 102, referred to herein as a "sensor stack." In one embodiment, for instance, the logic die 103 (which may be an application specific integrated circuit (ASIC)) and sensor die 101 are disposed and coupled to one-another in a flip-chip configuration (i.e., contact-surfaces of the two dies facing one another) to enable a massively parallel and thus relatively high-bandwidth interconnect 106 between the two chips. This arrangement also enables backside illumination of photosensitive elements (e.g., photodiodes) within the sensor's pixel array 102 (shown as having $n_{rows}$ and $n_{cols}$). While this sensor stack arrangement is carried forward in the description that follows, various other wide-band sensor die/logic die configurations may be employed in all cases (for example, the circuitry within logic die 103 and sensor die 101 may be implemented in a single die instead of separate dies).

Still referring to FIG. 1, logic die 103 is coupled to an image signal processor 115 (ISP, which may alternatively be an SoC or other processing unit) via a relatively narrow-bandwidth signaling interface 108 to enable real-time chip-to-chip transfer of image data in various stages of reconstruction (including no reconstruction at all as discussed below) from the sensor stack to ISP 115. As shown, logic die 103 contains on-chip buffer memory 104 that may be used to buffer subframe image data (i.e., data to be combined with data from one or more other subframes as part of output image reconstruction) and ISP 115 is coupled to a system memory 117 which may also be used to buffer subframe image data. In a number of implementations, the logic-die buffer memory 104 is implemented by relatively area-inefficient (and thus low-capacity) and power-hungry static random access memory (SRAM) to avoid the fabrication and performance compromises generally required to merge more power- and area-efficient memory technologies (e.g., dynamic random access memory (DRAM)) onto the same die as CMOS (complementary metal oxide semiconductor) logic circuits. By contrast, as system memory 117 may be implemented by a much higher capacity DRAM chip, the ISP is provided with a relatively unlimited subframe buffering capability.

Figure 2:
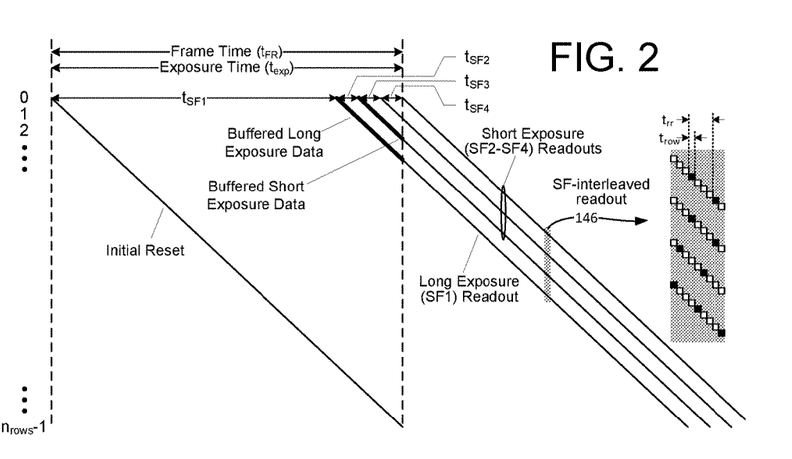
FIG. 2 illustrates an exemplary subframe image data readout within the oversampled sensor die of FIG. 1.

FIG. 2 illustrates an exemplary subframe image data readout within the oversampled sensor die of FIG. 1. As shown, each row of pixels within the pixel array within sensor die 101 is reset one after another at the start of an image frame interval ($t_{FR}$), and then exposed to light over a net exposure interval, $t_{exp}$. The net exposure interval spans multiple subframe intervals with a respective row readout operation occurring after each subframe interval to yield ×N oversampling. More specifically, in the example presented, the image sensor is readout after each of four sequential subframe exposure intervals, tSF1-tSF4, to produce four subframes of image data and thus ×4 oversampling. Each subframe of image data is constituted by $n_{cols}*n_{rows}$ pixel values and thus a total image data production of $N*n_{rows}*n_{cols}*b_{SSF}$, where '*' denotes multiplication and $b_{SSF}$ is the number of bits (or "bit depth") per pixel value for a single subframe. Accordingly, the oversampled image sensor produces substantially more raw readout data than a conventional single-sample-per-frame image sensor—roughly in proportion with the oversampling factor, N.

In the readout diagram of FIG. 2 and others discussed below, the initial reset operation and each of the subframe sampling operations (also referred to herein as subframe readouts) is shown as a diagonal line to indicate the time-wise sequencing through the rows of the pixel array, from row 0 to $n_{rows}$−1. In general, the time required to readout a given row of the image sensor, $t_{row}$ (the "row time"), is constrained by the operational sequence required to generate a respective digitized readout value for each of the pixels within that row and is designed to ensure that all rows of the pixel array may be readout within a target minimum frame time, $t_{FR-min}$.

Reflecting on the relative durations of the subframes shown in FIG. 2, the first subframe exposure is substantially longer than the final three, which, at least in the embodiment shown, have uniform and relatively short durations. This long-exposure, multiple-short-exposure subframe sampling arrangement generally increases the dynamic range of the imaging system, as low-light regions of a scene yield appreciable signal levels in the long exposure subframe and bright-light regions of the scene, which drive the subject pixels to saturation in the long-exposure subframe (i.e., reach the full-well potential of the photodiode or other photosensitive element within individual pixels of the pixel array), yield non-saturated signals in each of the short-exposure subframes. Also, capturing multiple, same-duration short-exposure subframes enables those subframes to be combined using relatively simple circuitry and/or processing operations, thus mitigating the higher noise inherent in short-exposure image data. Note that row operations are not executed simultaneously with respect to the different subframe readouts, but rather are interleaved as shown at 146 such that the overall subframes are read out concurrently. That is, row operations are executed in round-robin fashion, with individual row time slots (i.e., row operation times, or $t_{row}$) being allocated in a repeating sequence to each of the N subframes (where oversampling factor N=4 in the example shown). Each allocated timeslot is shown as a black square in a given subframe readout sequence to make clear that only one out of every N timeslots is allocated to a given subframe readout, with the remaining N−1 timeslots being allocated respectively to the remaining N−1 subframe readouts. Because only one out of every N timeslots is allocated to a given subframe readout, the subframe readout rate (or roll rate) scales in accordance with the oversampling factor, N, with the time between successive row readouts of a given subframe ($t_{rr}$—referred to herein as the "subframe row time") being $N*t_{row}$.

Figure 3:
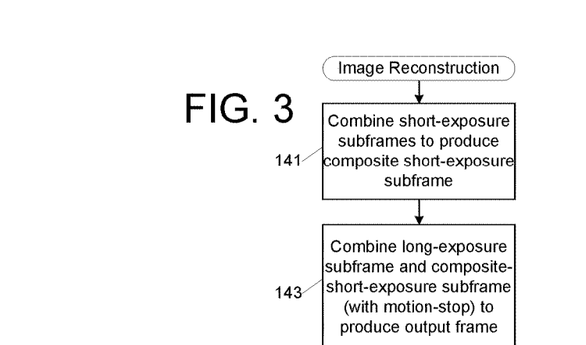
FIG. 3 illustrates an exemplary sequence of image reconstruction operations that may be executed to generate an output image frame from the subframe readouts shown in FIG. 2.

FIG. 3 illustrates an exemplary sequence of image reconstruction operations that may be executed to generate an output image frame from the subframe readouts shown in FIG. 2. Starting at 141, the short-exposure subframes are combined to produce a composite short-exposure subframe. This operation is simplified either by implementing the uniform-duration short exposure subframes in the exemplary sampling arrangement shown in FIG. 2 or by compensating for non-uniform exposure durations with different readout gains, as the pixel values obtained in the three short exposure subframes may be combined through simple summation or multiply-accumulate operation. At 143, the long-exposure subframe and composite short-exposure subframe are combined to produce an output subframe. The long-exposure/short-exposure combination, referred to herein as a two-frame reconstruction, may be implemented in numerous ways, but generally includes a comparison of pixel values from two incoming subframes (long-exposure and composite short-exposure) to determine whether object motion has occurred (and, if so, using the short exposure data instead of the long exposure data to reduce blur), determination whether long-exposure pixels have saturated (again, using short exposure data instead of long exposure data) and determination whether light thresholds are above a short-exposure noise floor (using long exposure data instead of short exposure data to reduce noise). Where valid (nonsaturated, noneclipsed, above-noise-threshold) pixels are obtained in both the long and short exposures, the composite short-exposure pixel values may be combined (e.g., summed) with the long-exposure pixel values to yield an output image.

To accommodate the reconstruction approach shown in FIG. 3, long exposure data for a given row of pixels is temporarily stored (buffered) in a buffer memory until all three short exposure pixel values for that row have been obtained, with the finalized output pixel value then being transferred to a separate frame buffer (e.g., for rendering or other processing). Similarly, in embodiments which combine short-exposure subframes with one another before combining the resulting composite short-exposure subframe with the long-exposure subframe, data obtained from all but the last short-exposure for a given pixel row is buffered until the last (final) short-exposure readout is executed. As shown in FIG. 2, the total amount of buffered data for the long exposure is dependent on the number of row readout operations carried out in the time between the long exposure readout and end-of-frame and thus on the exposure time fraction spanned by the N short exposures (i.e., $t_{exp}*(d_2+d_3+d_4)/(d_1+d_2+d_3+d_4)$, where $d_i$ is the relative duration of a given exposure interval) divided by the subframe row time, $t_{rr}$. This number of row readouts is multiplied by the number of pixel values obtained in each readout operation (i.e., $n_{cols}$) and the bit depth of each pixel value, $b_{SSF}$—the bit depth of a single subframe, to yield the long-exposure buffer size. Generalizing the oversampling factor to N, and assuming only one long subframe, the volume of buffered long exposure data (and thus the requisite long-exposure buffer memory size) is given by:

$$Mem(\text{long\_exp}) = n_{cols} \cdot b_{SSF} \cdot \frac{\sum_{i=2}^{N} d_i}{\sum_{i=1}^{N} d_i} \cdot \frac{t_{exp}}{t_{rr}}$$

Similarly, the total amount of buffered data for each short exposure is dependent on the number of row readout operations carried out in the time between the subject short exposure readout and the final short exposure readout and is thus given by:

$$Mem(\text{short\_exp}\,x) = n_{cols} \cdot b_{SSF} \cdot \frac{\sum_{i=x+1}^{N} d_i}{\sum_{i=1}^{N} d_i} \cdot \frac{t_{exp}}{t_{rr}},$$

where 'x' denotes the subframe index of a given short subframe (i.e., x=2, 3 or 4 in the 4× oversampling arrangement shown in FIG. 2).

In a number of embodiments, reconstruction logic within the sensor stack (i.e., logic die component thereof) and/or ISP includes accumulation logic to combine short exposure readout data as it becomes available—that is, after buffering an initial short exposure readout for a given row, adding subsequent short exposure readout data for that row in situ so that, except for the additional bit depth needed to accommodate short-exposure summation, no additional buffer memory is required for short exposure subframes beyond the first short exposure. This operation is reflected in FIG. 2 which shows buffering of only the first short exposure. With this optimization, the amount of buffered short exposure data becomes:

$$Mem(\text{short\_exp}) = n_{cols} \cdot b_{CSSF} \cdot \frac{\sum_{i=3}^{N} d_i}{\sum_{i=1}^{N} d_i} \cdot \frac{t_{exp}}{t_{rr}},$$

where $b_{cssf}$ is the bit depth of the combined short-exposure pixel values.

Figure 4:
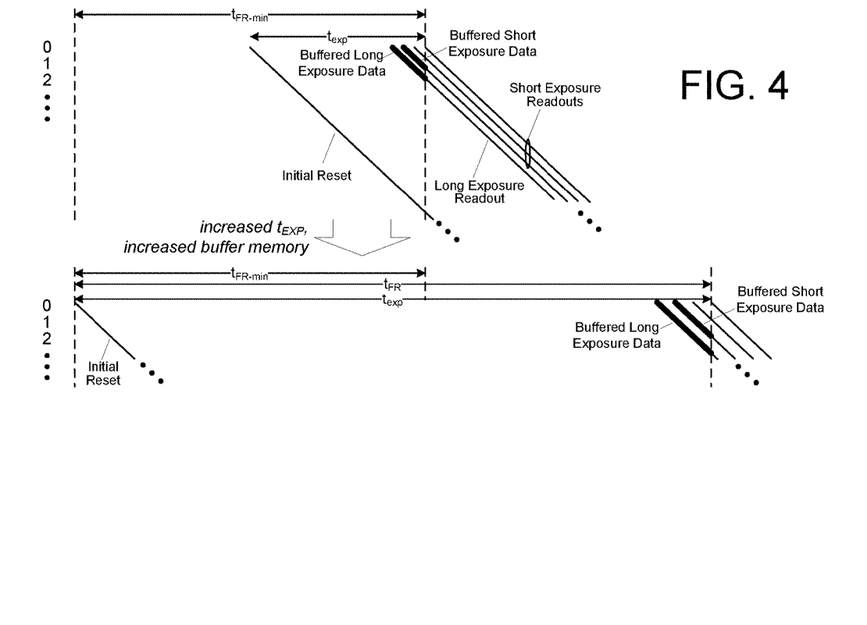
FIG. 4 illustrates an exemplary dependency between volume of buffered data and exposure time within the imaging system of FIG. 1.

Reflecting on the short-exposure and long-exposure buffered data expressions above, it can be seen that, so long as the sampling policy (i.e., quantity and relative durations of subframes) and the row time remains constant, the total required buffer storage will increase and decrease in accordance with the net exposure time, $t_{exp}$. FIG. 4 illustrates this circumstance, showing the relatively small amount of buffer storage required for the long exposure and combined short exposures for a shorter net exposure time (i.e., an exposure time less than a minimum frame time, $t_{FR-min}$, in the example shown), and the relatively large amount of buffer storage required for the long exposure and combined short exposures for a longer net exposure time.

Figure 5A:
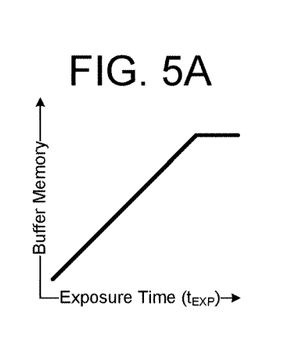
FIG. 5A illustrates the buffer memory capacity/exposure time relationship described in reference to FIG. 4, demonstrating that buffer memory requirement increases proportionally with exposure time, eventually reaching a plateau (maximum required memory) when the exposure time becomes so long that all non-final subframes are fully readout before commencement of final subframe readout.
Figure 5B:
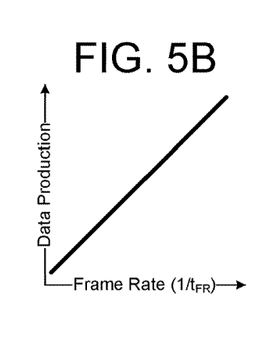
FIG. 5B illustrates a similar linear dependence between image data production rate and frame rate (i.e., more image data is produced per unit time as frame rate increases)
Figure 5C:
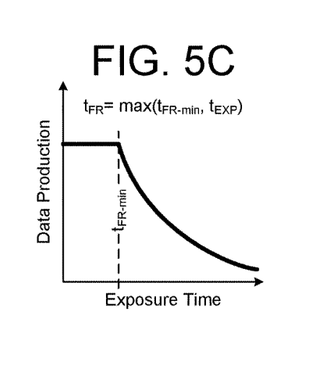
FIG. 5C profiles image data production rate as a function of exposure time, assuming that the frame time is maintained at or above a predetermined minimum frame time, $t_{FR-min}$.

FIG. 5A illustrates the buffer memory capacity/exposure time relationship described above, demonstrating that buffer memory requirement increases proportionally with exposure time, eventually reaching a plateau (maximum required memory) when the exposure time becomes so long that all non-final subframes are fully readout before commencement of final subframe readout (a circumstance not specifically accounted for in the equations above). FIG. 5B illustrates a similar linear dependence between image data production rate and frame rate (i.e., more image data is produced per unit time as frame rate increases toward a practicable maximum) and FIG. 5C profiles the same image data production rate as a function of exposure time, assuming that the frame time is maintained at or above a predetermined minimum frame time, $t_{FR*min}$). Thus, as FIG. 5C demonstrates, the data production rate remains steady for exposure times below tFR-min, then falls hyperbolically with exposure time (i.e., in view of the inverse proportionality between frame rate and exposure times above $t_{FR-min}$). Finally, FIG. 5D overlays the buffer memory and data production profiles of FIGS. 5A and 5C, emphasizing their duality with respect to changing exposure time. That is, as exposure time increases, requisite buffer memory increases while image data production rate drops and, conversely, as exposure time decreases, image data production rate rises while buffer memory requirement falls.

Figure 5D:
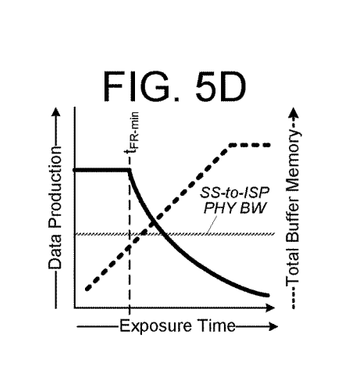
FIG. 5D illustrates an exemplary bandwidth limit imposed by the physical signaling path between a sensor stack and image signal processor (ISP)

FIG. 5D also illustrates an exemplary bandwidth limit ("SS-to-ISP PHY BW") imposed by the physical signaling path between the sensor stack and ISP (i.e., signaling path shown at 108 in FIG. 1) and thus within the physical signaling interfaces (PHYs) of the logic die and ISP. As can be seen, as exposure time drops below a given threshold, the data production level (solid line) exceeds the SS-ISP bandwidth. As discussed below, this insight is exploited in determining the site of output image reconstruction operations.

As discussed with reference to FIG. 1, logic die 103 within sensor stack 103 includes a relatively low-capacity buffer memory 104 that may be used to buffer short-exposure and/or long-exposure data. Consequently, because both the sensor stack and ISP have data buffering capability (e.g., SRAM and DRAM, respectively, as discussed above), it becomes possible, through provision of reconstruction logic (e.g., programmed processor and/or hardwired circuitry) within the sensor stack and ISP, to carry out image reconstruction operations on either or both chips. In particular, the two reconstruction phases shown in the overall reconstruction workload of FIG. 3—short-exposure combination and two-frame (long exposure and composite-short exposure) reconstruction—may both be executed entirely within the sensor stack (e.g., in reconstruction logic within the logic die), entirely within the ISP, or split between the sensor stack and ISP. In the split-workload case, the relatively simple short exposure combination may be carried out within the sensor stack while the more process-intensive two-frame reconstruction is carried out within the ISP. Other workload divisions may be identified and allocated between the sensor stack and ISP in alternative embodiments or configurations, particularly in the case of sampling policies that may include additional subframes and/or different relative durations between subframes.

Figure 6:
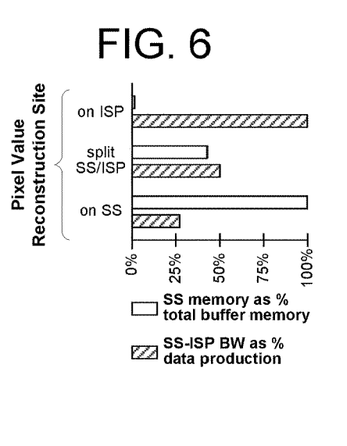
FIG. 6 illustrates approximate sensor-stack buffer memory usage as a percentage of total required buffer memory, and approximate SS-ISP signaling bandwidth usage as a percentage of total image data production rate according to each of three different reconstruction workload allocations.

FIG. 6 illustrates approximate sensor-stack buffer memory usage as a percentage of total required buffer memory, and approximate SS-ISP signaling bandwidth usage as a percentage of total image data production rate according to each of the three different reconstruction workload allocations discussed above (i.e., entirely on sensor stack, entirely on ISP and split between sensor stack (SS) and ISP), assuming 4× oversampling and uniform short subframe durations. As shown, if image reconstruction is carried out entirely within the ISP and system memory ("on ISP"), then the required sensor-stack buffer memory drops to zero (or near zero as a row buffer may be provided to store row data prior to transfer), while the required signaling bandwidth corresponds to 100% of the image data production—that is, all subframe data is transferred from the sensor stack to the ISP. Conversely, if image reconstruction is carried out entirely on the sensor stack ("on SS" and thus within the logic die component thereof), then all required buffering occurs within the sensor stack (100%) and the required signaling bandwidth drops to just over 25% of total image data production as only one frame of data is transferred to the ISP instead of four, albeit at a slightly higher bit depth.

Figure 7A:
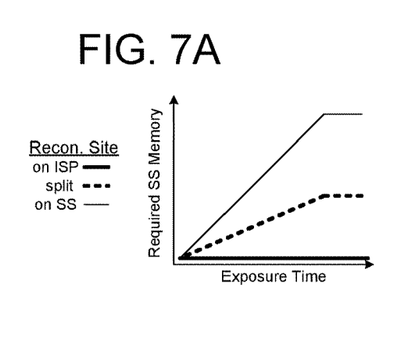
FIG. 7A profiles the sensor-stack buffer memory/exposure-time dependence for the three reconstruction workload allocations shown in FIG. 6.

FIG. 7A profiles the sensor-stack buffer memory/exposure-time dependence for the three reconstruction workload allocations shown in FIG. 6. As discussed, when reconstruction is carried out entirely within the ISP, little or no sensor-stack buffer memory is required as each pixel data value is transferred to the ISP as it becomes available. By contrast, when reconstruction is performed entirely within the sensor stack, the requisite sensor-stack buffer memory size rises quickly with exposure time, plateauing when $t_{exp}$ becomes so long that all non-final subframes are fully read-out before final subframe readout begins. In between those two extremes, required sensor-stack buffer memory rises more slowly with exposure time in the split reconstruction approach plateauing at the same $t_{exp}$ point as the on-sensor-stack case. Expressing the three sensor-stack memory requirements ("SS_Mem") mathematically:

Reconstruction fully within ISP:

$$SS\_Mem=0$$

Split ISP/SS reconstruction (combination of short subframes on sensor stack, reconstruction of full image within ISP, so that buffering is required only for summed short exposure subframes):

$$SS\_Mem = n_{cols} \cdot b_{CSSF} \cdot \frac{\sum_{i=3}^{N} d_i}{\sum_{i=1}^{N} d_i} \cdot \frac{t_{exp}}{t_{rr}}$$

Reconstruction fully within sensor stack (requiring data buffering for summed short exposure subframes, as in the split ISP/SS reconstruction case, and also for the long exposure subframe):

$$SS\_Mem = n_{cols} \cdot b_{CSSF} \cdot \frac{\sum_{i=3}^{N} d_i}{\sum_{i=1}^{N} d_i} \cdot \frac{t_{exp}}{t_{rr}} + n_{cols} \cdot b_{SSF} \cdot \frac{\sum_{i=2}^{N} d_i}{\sum_{i=1}^{N} d_i} \cdot \frac{t_{exp}}{t_{rr}}$$

Figure 7B:
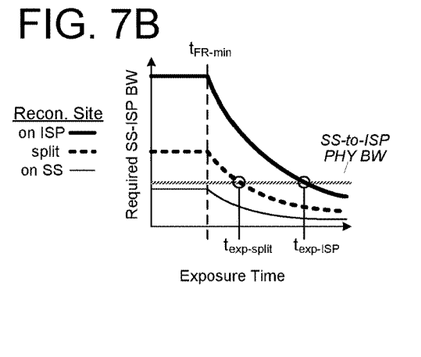
FIG. 7B the profiles the SS-ISP signaling bandwidth/exposure-time dependence for the three reconstruction workload allocations shown in FIG. 6, assuming that a constant frame rate ($1/t_{FR-min}$) applies for exposure times less than $t_{FR-min}$.

FIG. 7B profiles the SS-ISP signaling bandwidth/exposure-time dependence for the three reconstruction workload allocations shown in FIG. 6, assuming, as discussed above, that a constant frame rate t ($1/t_{FR-min}$) applies for exposure times less than $t_{FR-min}$. As shown, when reconstruction is carried out entirely within the sensor stack, a relatively low signaling bandwidth is required, under the maximum data transfer capacity of the physical signaling interface limit for all exposure times. By contrast, when reconstruction is performed entirely within the ISP, a much more pronounced bandwidth/exposure-time dependence results, with the requisite signaling bandwidth exceeding the ceiling imposed by the physical signaling interface for exposure times less than $t_{exp-ISP}$. Again, the split ISP/SS reconstruction approach yields an intermediate resource requirement, in this case a more pronounced bandwidth/exposure-time dependence than the exclusively-on-sensor-stack reconstruction and a less pronounced dependence than the exclusively-on-ISP reconstruction, with the requisite signaling bandwidth exceeding the capability of the physical signaling interface for exposure times less than $t_{exp-split}$. Expressing the three sensor-stack-to-ISP bandwidth requirements (q) mathematically:

Reconstruction fully within ISP so that readout data for each of N subframes is transferred from the sensor stack to the ISP in accordance with frame rate, f:

$$q = f \cdot n_{rows} \cdot n_{cols} \cdot b_{SSF} \cdot N$$

Split ISP/SS reconstruction (combination of short subframes on sensor stack, reconstruction of full image within ISP, so that only the long exposure subframe and the combined short exposure subframes need be transferred):

$$q = f \cdot n_{rows} \cdot n_{cols} \cdot (b_{SSF} + b_{CSSF})$$

Reconstruction fully within sensor stack so that only the output image frame (having a bit depth of $b_{recon}$) need be transferred:

$$q = f \cdot n_{rows} \cdot n_{cols} \cdot b_{recon}$$

Reflecting on FIGS. 7A and 7B, it is notable that reconstruction exclusively on the sensor-stack is viable for all exposure times, while the split SS/ISP and ISP-exclusive reconstruction approaches are viable only for longer exposure times. On the other hand, as FIG. 7A shows, employing on sensor-stack reconstruction across all exposure times will require significantly more sensor-stack buffer memory than the other two approaches. These insights (as well as the duality between data production and buffering noted with respect to FIG. 5) are exploited in a number of embodiments by dynamically shifting the reconstruction workload between the sensor stack and ISP in accordance with the net exposure time allocated for a given image frame capture. That is, for exposure times less than $t_{exp-split}$, reconstruction is carried out exclusively on the sensor stack, thus maintaining the net data transfer bandwidth under the ceiling imposed by the ISP/SS signaling path. For exposure times between $t_{exp-split}$ and $t_{exp-ISP}$, reconstruction is split between the sensor stack and ISP (i.e., combining short subframes on the sensor stack) and for exposure times above $t_{exp-ISP}$, reconstruction is carried out entirely on the ISP. Through this reallocation of reconstruction workload as exposure times progress into and out of the ranges established by the $t_{exp-split}$ and $t_{exp-ISP}$ switchover thresholds/boundaries), the requisite data transfer bandwidth is maintained within the capability of the physical signaling interface between the sensor stack and ISP while required sensor stack memory is held substantially below the capacity needed to reconstruct entirely on the sensor stack across the full range of exposure times.

Figure 8:
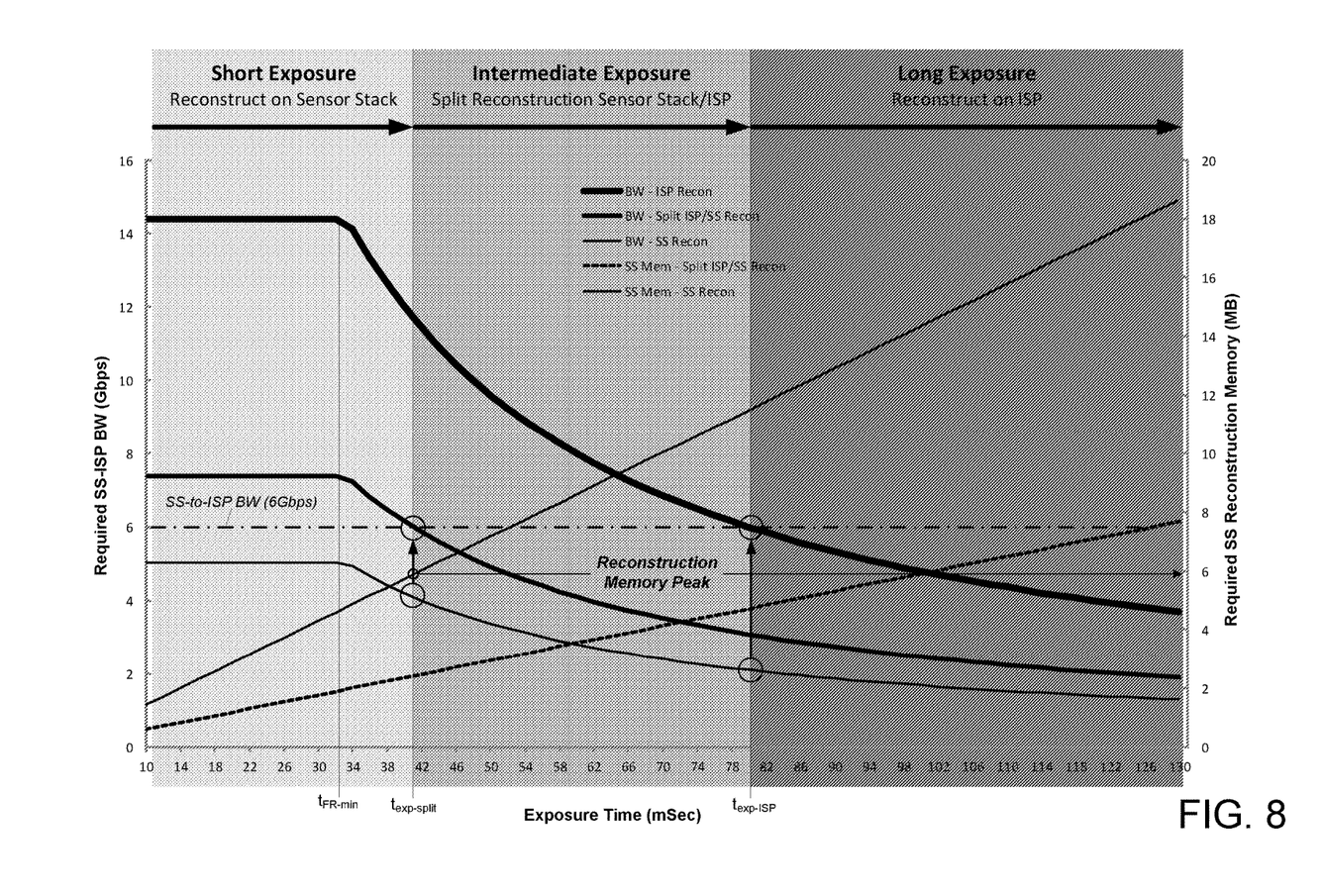
FIG. 8 is an exemplary plot of SS-ISP bandwidth and memory requirements across a range of exposure times in a 16 megapixel, 4× oversampled image sensor.

FIG. 8 is an exemplary plot of SS-ISP bandwidth and memory requirements across a range of exposure times in a 12 megapixel (e.g., 3000 row×4000 column), 4× oversampled image sensor. In the example shown, each of three successive short exposures is assumed to transpire over $1/16^{th}$ of the net exposure interval (i.e., relative exposure durations of 13,1,1,1 for each of the four subframes), bit depths of a single subframe, combined short subframes and the fully reconstructed image are 10 bits, 10.5 bits and 14 bits, respectively (i.e., $b_{SSF}=10$, $b_{CSSF}=10.5$ and $b_{recon}=14$), and the image sensor sequences through each subframe readout in a $t_{FR-min}$ interval of $1/30^{th}$ second so that row time $t_{row}=1/$ (4000*30*4) and subframe row time $t_{rr}=1/(4000*30)$. Note that the 10.5-bit combined short-subframe bit depth reflects an average storage capacity as only half the total short-subframe storage need accommodate a sum of two short-exposure subframes (11 bits, assuming a 10-bit $b_{SSF}$), while the other half stores solitary short-exposure subframe data (10 bits).

As FIG. 8 illustrates, for net exposure times ranging from a predetermined minimum (not shown in the plot) to a $t_{exp-split}$ switchover threshold of approximately 41 mSec, reconstruction is performed entirely within the sensor stack, keeping the peak required sensor-stack-to-ISP transfer bandwidth just under 6 Gbps and the peak required sensor-stack buffer memory just under 6 MB (e.g., enabling PHY implementation with a four-lane MIPI CSI-2 interface or two-lane MIPI CSI-3 interface and cost-effective buffer memory implementation). For this range of exposures ("Short Exposure"), the logic die within the sensor stack (and possibly some circuitry on the sensor die itself) buffers long-exposure and short-exposure subframe data, combines the short-exposure subframes to generate a composite-short exposure subframe and then combines the long-exposure subframe and composite short-exposure subframe to produce an output image (e.g., as described above in reference to FIG. 3), transferring only the output image to the ISP.

When the exposure time rises or falls into the range bounded by the $t_{exp-split}$ and $t_{exp-ISP}$ switchover thresholds (i.e., "Intermediate Exposure"), workload allocation logic within the imaging system (e.g., implemented through software execution within the ISP or another processor within the imaging system) reallocates the reconstruction workload, configuring the sensor stack to output long-exposure data as it becomes available, combine short exposure subframe data as it becomes available, and output composite short-exposure data as it is completed (i.e., outputting composited short-exposure data for a given row of pixels upon readout of the final short-exposure data for that row). The imaging system also configures the ISP's image processing logic to buffer incoming long exposure data and to combine the buffered long-exposure data with incoming composited short-exposure data to finalize the output image.

Still referring to FIG. 8, when the exposure time rises above the $t_{exp-ISP}$ threshold (i.e., "Long Exposure"), the workload allocation logic again reallocates the reconstruction workload, configuring the sensor stack to output long exposure data and short exposure data as it becomes available (i.e., no sensor-stack buffering or subframe data combination), and configuring the ISP's image processing logic to buffer incoming long exposure data, buffer incoming short exposure data, combine short exposure data for different subframes to produce composited short exposure subframe data and then combine the buffered long exposure data and composited short exposure data to produce an output image.

Reflecting on FIG. 8, it can be seen that reconstruction is performed with an SS-to-ISP bandwidth less than half the worst-case level (14.4 Gbps) and a memory size dramatically lower than the peak memory requirement for on-sensor-stack reconstruction (which eventually plateaus at 30 MB). Of course, the various memory and bandwidth requirements, as well as the number and value of switchover thresholds will vary with changes in sensor size, system parameters and/or sampling policy.

Figure 9:
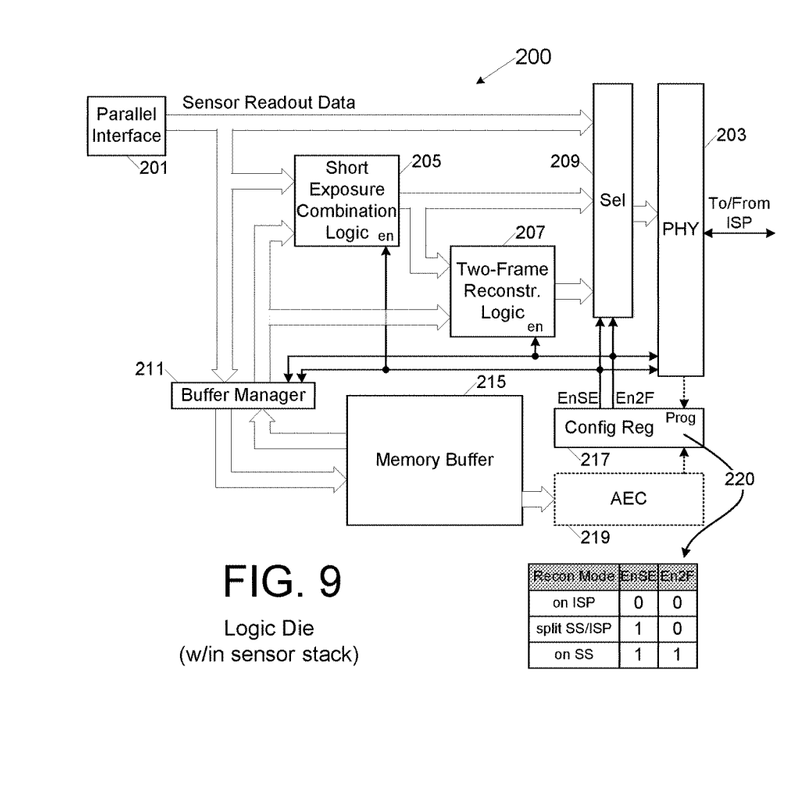
FIG. 9 illustrates an embodiment of configurable reconstruction logic that may be implemented within the logic die of the sensor stack shown in FIG. 1.

FIG. 9 illustrates an embodiment of configurable reconstruction logic 200 that may be implemented within the logic die of the sensor stack shown in FIG. 1. As shown, reconstruction logic 200 includes a high-bandwidth parallel interface 201 to receive sensor readout data from the image sensor die and a relatively low-bandwidth physical signaling interface (PHY) 203 to transfer image data in various stages of reconstruction to an image signal processor (ISP) (which may alternatively be a system-on-chip or other processing unit). The PHY 203 may also receive control signals, configuration data, etc. from the ISP and/or such information may be received in whole or part via an alternative signaling interface, not shown. Coupled between the parallel interface and PHY, reconstruction logic 200 includes short-exposure combination logic 205, two-frame reconstruction logic 207, memory buffer 215, buffer manager 211, programmable configuration register 217, data selector 209 (Sel) and an optional auto-exposure controller (AEC) 219.

In the embodiment shown, configuration register 217 is programmed with one of at least three different reconstruction mode values to implement different reconstruction options in accordance with exposure time settings, sampling policies and possibly other operational parameters (e.g., line interleaving mode as discussed below). For example, the auto-exposure controller, whether integrated on chip with the reconstruction logic or implemented within another imaging system component, may determine the exposure time and sampling policy in accordance with sensor data (e.g., buffered within memory buffer 215 or elsewhere) and then program the reconstruction mode within configuration register 217 accordingly (i.e., via direct signaling or by issuing programming commands and data via the PHY or other signaling interface). In any case, configuration register 217 outputs control signals for selectively enabling and disabling the short-exposure combination logic (EnSE) and two-frame reconstruction logic (En2F) in accordance with the programmed reconstruction mode. As shown, those control signals are also provided to data selector 209 and PHY 203 to select either the raw sensor data, combination of raw long exposure data and composited short-exposure data, or fully reconstructed image data to be delivered to PHY 203 (and output therefrom to the ISP), and to buffer manager 211 to enable selective buffering of the raw sensor readout data. More specifically, following the approach outlined in FIGS. 7B and 8, the configuration register may be programmed as shown in table 220 to allocate the reconstruction workload entirely to the ISP (EnSE=En2F=0), entirely to the sensor stack (EnSE=En2F=1) or in a split (or collaborative) distribution between the ISP and sensor stack (EnSE=1, En2F=0). In the "on ISP" reconstruction mode, the low states of the EnSE and En2F signals disable short-exposure combination logic 205 and two-frame reconstruction logic 207, respectively, signal the buffer manager 211 that no subframe data need be buffered, and configure data selector 209 and PHY 203 to transfer all subframe data to the ISP for remote reconstruction. Conversely, in the "on SS" reconstruction mode," the high states of the EnSE and En2F signals enable both the short-exposure combination logic and two-frame reconstruction logic, and also signal the buffer manager that both long-exposure and short-exposure subframe data is to be stored within buffer memory 215 up to the point of complete pixel row reconstruction, and signal the data selector and PHY to output fully reconstructed image data provided by the two-frame reconstruction logic. In the intermediate "split SS/ISP" reconstruction mode, the high-state of the EnSE signal and low state of the En2F signal enable the short exposure combination logic and disable the two-frame reconstruction logic, respectively, inform the buffer manager that only short-exposure data need be buffered, and signal the selector and PHY that raw long-exposure data is to be output to the ISP without buffering and that composite short subframe data provided by the short-exposure combination logic is to be output as it becomes available. Note that buffer manager 211 serves not only to selectively buffer incoming data, but also to selectively retrieve buffered data from memory buffer 215 as needed for on-chip reconstruction operations. In one embodiment, memory buffer 215 is implemented with single-port a bidirectional input/output interface, though separately addressable input and output ports may alternatively be provided to enable data storage and retrieval operations to be carried out simultaneously. As discussed above, on-chip auto-exposure controller 219 may also access buffered image data to ascertain scene luminance (and/or other characteristics evaluated to set exposure time, sampling policy, reconstruction mode, etc.).

Figure 10:
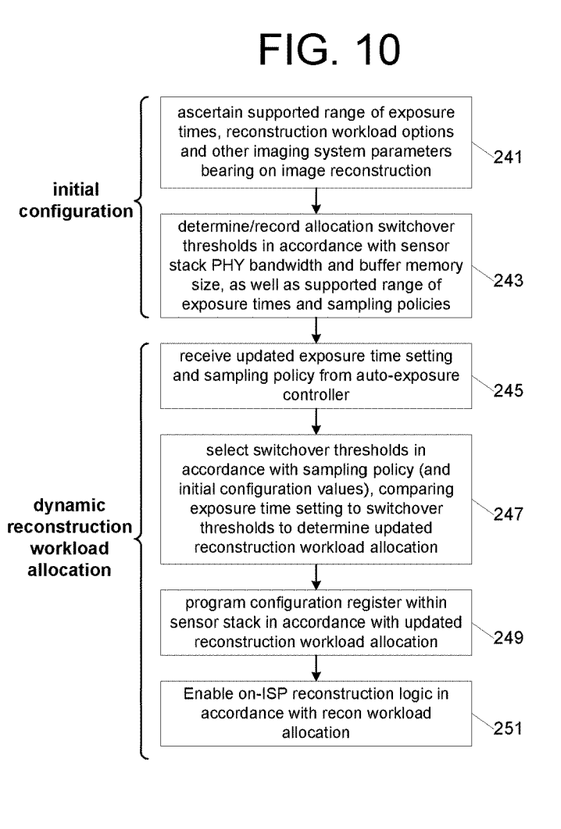
FIG. 10 illustrates a sequence of operations that may be implemented within the ISP or other processor of the imaging system of FIG. 1 to dynamically reconfigure image reconstruction workload.

FIG. 10 illustrates a sequence of operations that may be implemented within the ISP or other processor of the imaging system of FIG. 1 to dynamically reconfigure image reconstruction workload. If not pre-stored within the ISP or its executable code storage, the ISP may initially communicate with the sensor stack as shown at 241 to ascertain the supported range of exposure times, sensor-stack PHY bandwidth, sensor-stack buffer memory capacity, sampling policies (including oversampling factors), imaging resolutions/modes (e.g., line interleaved, reduced spatial resolution through pixel group binning, number of rows, number of columns, row times, etc.) and reconstruction workload options supported by the sensor die stack. To complete the initial configuration, the ISP determines and records applicable reconstruction allocation breakpoints at 243 (e.g., texp-split and texp-ISP switchover thresholds as discussed above) in accordance with the sensor-stack PHY bandwidth and buffer memory capacity, as well as the supported range of exposure times and sampling policies. Thereafter, starting at 245, the ISP (or workload allocation engine implemented by programmed code execution within the ISP) selects a reconstruction workload allocation in response to real-time input from the auto-exposure controller, including for example and without limitation, an exposure time setting and/or sampling policy setting. For example, the ISP may occasionally receive updated exposure time setting and sampling policy information from an auto-exposure controller component of the memory system (which may itself be implemented within the ISP) as shown at 245 and then compare the specified exposure time to a sampling-policy-indexed set of workload allocation switchover points at 247, selecting the workload allocation according to the exposure-time range in which the specified exposure time falls. After determining the reconstruction workload allocation, the ISP programs a configuration register within the sensor stack accordingly at 249 (e.g., issuing one or more commands and any necessary operands to the sensor stack to program the configuration register with the selected reconstruction workload allocation) and also configures on-ISP reconstruction logic (e.g., setting flags, semaphores or the like in the case of a software implementation) at 251 to enable and disable on-ISP reconstruction operations in accordance with the selected workload allocation.

As generally discussed above, imaging parameters that bear on the data production rate and/or sampling policy may also be taken into account by logic (or circuitry) that selects between the different reconstruction workload allocations (and thus the different data output formats of the sensor stack). For example, in a line-interleaved configuration in which pixel rows are dedicated to either long-exposure data production or short-exposure data production in an alternating (interleaved) spatial pattern (e.g., even numbered pixel rows dedicated to long-exposure data production and are read once per frame, and odd numbered pixel rows are dedicated to short-exposure data production and are read N−1 times per frame or vice-versa), the bandwidth and buffer memory size equations set forth above will change in accordance with the line interleaving mode as follows, where S=1 for non-line interleaved operation and S=2 for line-interleaved operation:

Reconstruction fully on SoC:

$$q = \frac{f \cdot n_{rows} \cdot n_{cols} \cdot b_{SSF} \cdot N}{S}$$

$$m = 0$$

Combination of short subframes on sensor stack, reconstruction of full image on SoC $$q = \frac{f \cdot n_{rows} \cdot n_{cols} \cdot (b_{SSF} + b_{CSSF})}{S}$$

$$m = \frac{n_{cols} \cdot b_{CSSF}}{S} \cdot \frac{\sum_{i=3}^{N} d_i}{\sum_{i=1}^{N} d_i} \cdot \frac{t_{exp}}{t_{rr}}$$

Full reconstruction on sensor stack:

$$q = \frac{f \cdot n_{rows} \cdot n_{cols} \cdot b_{recon}}{S}$$

$$m = \frac{n_{cols} \cdot b_{CSSF}}{S} \cdot \frac{\sum_{i=3}^{N} d_i}{\sum_{i=1}^{N} d_i} \cdot \frac{t_{exp}}{t_{rr}} + \frac{n_{cols} \cdot b_{SSF}}{S} \cdot \frac{\sum_{i=2}^{N} d_i}{\sum_{i=1}^{N} d_i} \cdot \frac{t_{exp}}{t_{rr}} \cdot (2 - S)$$

Bandwidth and buffer memory size requirements (and thus the switchover exposure time thresholds) may also change in various reduced spatial-resolution modes (e.g., where contributions from two or more pixels are combined in the charge and/or voltage domains of the image sensor to improve sensitivity.

Data compression techniques may also bear on required bandwidth and/or buffer memory. For example, in a number of embodiments, readout data is encoded (e.g., using a visually lossless lookup table (VLL) or other data compression approach) prior to being buffered, then expanded to full-range data prior to combination with data from other subframes. In a number of embodiments, for example, subframe data is compressed by one or two bits, which, in an exemplary 10-bit subframe bit-depth, constitutes a 10% to 20% reduction in data storage requirement. Additionally (or alternatively), imaging data may be encoded prior to transmission from sensor stack to ISP, thus reducing the net bandwidth requirement in accordance with the bit depth compression. In all such cases, changes in buffer memory and/or bandwidth requirements may impact reconstruction-mode switchover points, resulting in different exposure time/sampling policy switch over parameters than in embodiments that lack such encoding (or configurations in which such encoding is selectively disabled).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, bit depths, time intervals, sampling policies (including oversampling factor and/or relative subframe durations), signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an imaging system having an image sensor device, the method comprising:
   generating a plurality of subframes of image data corresponding to respective portions of an exposure interval; and
   depending at least in part on whether the exposure interval exceeds one or more exposure time thresholds, selecting one of at least two data output formats in which data representative of the plurality of subframes of image data are output from the image sensor device, including:
      a first data output format in which each of the subframes of image data is output in its entirety from the image sensor device; and
      a second data output format in which a logical combination of at least two of the subframes of image data is output from the image sensor device instead of the at least two of the subframes of image data such that the total volume of image data output from the image sensor device is reduced relative to the first data output format.

2. The method of claim 1 wherein (i) selecting one of the at least two data output formats comprises selecting one of at least three data output formats depending, at least in part, on whether the exposure interval exceeds both, only one, or neither of two different exposure time thresholds, (ii) at least one of the subframes of image data is output in its entirety in the second data output format, and (iii) the at least two data output formats includes a third data output format in which a logical combination of all the subframes of image data is output instead of the plurality of subframes of image data such that the total volume of image data output from the image sensor device is reduced relative to the second data output format.

3. The method of claim 1 wherein the plurality of subframes of image data includes a long-exposure subframe of image data that corresponds to a larger portion of the exposure interval than any individual one of the remaining subframes of image data, and wherein the long-exposure subframe of image data is output in its entirety in each of the first and second data output formats.

4. The method of claim 3 wherein the remaining subframes of image data constitute respective short-exposure subframes of image data that correspond to sequential uniform-duration portions of the exposure interval, and wherein all of the short-exposure subframes of image data are output in the logical combination in the second data output format.

5. The method of claim 4 wherein the logical combination in the second data output format comprises summation of constituent pixel values within the short-exposure subframes of image data.

6. The method of claim 4 wherein (i) selecting one of the at least two data output formats comprises selecting one of at least three data output formats depending, at least in part, on whether the exposure time interval exceeds both, only one, or neither of two different exposure time thresholds, (ii) at least one of the subframes of image data is output in its entirety in the second data output format, (iii) the at least two data output formats includes a third data output format in which a logical combination of all the subframes of image data is output instead of the plurality of subframes of image data such that the total volume of image data output from the image sensor device is reduced relative to the second data output format, and (iv) a summation of all the short-exposure subframes of image data is logically combined with the long-exposure subframe of image data to yield the logical combination in the third data output format.

7. The method of claim 1 wherein the image sensor device comprises an integrated-circuit logic die and an integrated-circuit sensor die disposed and interconnected in a stacked-die arrangement, and wherein generating the plurality of subframes of image data comprises exposing the integrated-circuit sensor die to light for the duration of the exposure interval and reading a respective one of the subframes of image data out of the integrated-circuit sensor die after each of a plurality of subexposure intervals that transpire in sequence and collectively constitute the exposure interval, and wherein selecting a corresponding one of at least two data output formats in which data representative of the plurality of subframes of image data are output from the image sensor device comprises receiving the subframes of image data within the integrated-circuit logic die and outputting the data representative of the plurality of subframes of image data from the integrated-circuit logic die via an interface to signaling path external to the image sensor device.

8. The method of claim 7 wherein selecting a corresponding one of at least two data output formats comprises determining within the integrated-circuit logic die whether the exposure interval exceeds the one or more exposure time thresholds.

9. The method of claim 7 wherein the imaging system further comprises a processing unit and wherein selecting a corresponding one of at least two data output formats comprises determining within the processing unit whether the exposure interval exceeds the one or more exposure time thresholds and programming a configuration register within the integrated-circuit logic die in accordingly.

10. The method of claim 1 further comprising determining the duration of the exposure interval in accordance with data representative of scene luminance.

11. The method of claim 1 wherein selecting the corresponding one of at least two data output formats comprises selecting the corresponding one of at least two data output formats depending at least in part on duration of the exposure interval and at least in part on relative durations of subexposures that constitute the respective portions of the exposure interval.

12. The method of claim 1 further comprising determining the one or more exposure time thresholds based at least in part on a signaling bandwidth of the image sensor device.

13. An imaging system having an image sensor device, the imaging system comprising:

circuitry to generate a plurality of subframes of image data corresponding to respective portions of an exposure interval; and circuitry to select one of at least two data output formats in which data representative of the plurality of subframes of image data is to be output from the image sensor device depending at least in part on whether the exposure interval exceeds one or more exposure time thresholds, the at least two data output formats, including:

a first data output format in which each of the subframes of image data is output in its entirety from the image sensor device; and a second data output format in which a logical combination of at least two of the subframes of image data is output from the image sensor device instead of the at least two of the subframes of image data such that the total volume of image data output from the image sensor device is reduced relative to the first data output format.

14. The imaging system of claim 13 wherein (i) the circuitry to select one of the at least two data output formats comprises circuitry to select one of at least three data output formats depending, at least in part, on whether the exposure interval exceeds both, only one, or neither of two different exposure time thresholds, (ii) at least one of the subframes of image data is output in its entirety in the second data output format, and (iii) the at least two data output formats includes a third data output format in which a logical combination of all the subframes of image data is output instead of the plurality of subframes of image data such that the total volume of image data output from the image sensor device is reduced relative to the second data output format.

15. The imaging system of claim 13 wherein the plurality of subframes of image data includes a long-exposure subframe of image data that corresponds to a larger portion of the exposure interval than any individual one of the remaining subframes of image data, and wherein the long-exposure subframe of image data is output in its entirety in each of the first and second data output formats.

16. The imaging system of claim 15 wherein the remaining subframes of image data constitute respective short-exposure subframes of image data that correspond to sequential uniform-duration portions of the exposure interval, and wherein all of the short-exposure subframes of image data are output in the logical combination in the second data output format.

17. The imaging system of claim 16 further comprising circuitry to implement the logical combination in the second data output format by summing constituent pixel values within the short-exposure subframes of image data.

18. The imaging system of claim 16 wherein (i) the circuitry to select one of the at least two data output formats comprises circuitry to select one of at least three data output formats depending, at least in part, on whether the exposure interval exceeds both, only one, or neither of two different exposure time thresholds, (ii) at least one of the subframes of image data is output in its entirety in the second data output format, and wherein the at least two data output formats includes a third data output format in which a logical combination of all the subframes of image data is output instead of the plurality of subframes of image data such that the total volume of image data output from the image sensor device is reduced relative to the second data output format, the imaging system further comprising circuitry to logically combine a summation of all the short-exposure subframes of image data with the long-exposure subframe of image data to yield the logical combination in the third data output format.

19. The imaging system of claim 13 wherein the image sensor device comprises an integrated-circuit logic die and an integrated-circuit sensor die disposed and interconnected in a stacked-die arrangement, and wherein the circuitry to generate the plurality of subframes of image data comprises circuitry to enable the integrated-circuit sensor to integrate photocharge for the duration of the exposure interval and to read a respective one of the subframes of image data out of the integrated-circuit sensor die after each of a plurality of subexposure intervals that transpire in sequence and collectively constitute the exposure interval, and wherein the circuitry to select a corresponding one of at least two data output formats in which data representative of the plurality of subframes of image data are to be output from the image sensor device comprises parallel interface circuitry to receive the subframes of image data within the integrated-circuit logic die from the integrated-circuit sensor die and a signaling interface to output the data representative of the plurality of subframes of image data from the integrated-circuit logic die via a signaling path external to the image sensor device.

20. The imaging system of claim 19 wherein the circuitry to select the one of at least two data output formats comprises circuitry within the integrated-circuit logic die to determine whether the exposure interval exceeds the one or more exposure time thresholds.

21. The imaging system of claim 19 wherein the imaging system further comprises a processing unit and wherein the circuitry to select a corresponding one of at least two data output formats comprises processor circuitry within the processing unit to determine, through program code execution, whether the exposure interval exceeds the one or more exposure time thresholds and to program a configuration register within the integrated-circuit logic die in accordingly.

22. The imaging system of claim 13 further comprising circuitry to determine the duration of the exposure interval in accordance with data representative of scene luminance.

23. The imaging system of claim 13 wherein the circuitry to select the one of at least two data output formats comprises circuitry to select the one of at least two data output formats depending at least in part on duration of the exposure interval and at least in part on relative durations of subexposures that constitute the respective portions of the exposure interval.

24. The imaging system of claim 13 further comprising a processing unit to determine the one or more exposure time thresholds based at least in part on a signaling bandwidth of the image sensor device.

* * * * *